(12) United States Patent
Takagiwa

(10) Patent No.: US 9,473,133 B2
(45) Date of Patent: Oct. 18, 2016

(54) CONTROL DEVICE

(71) Applicant: FUJI ELECTRIC CO., LTD., Kawasaki-shi (JP)

(72) Inventor: Kazumi Takagiwa, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 30 days.

(21) Appl. No.: 13/715,298

(22) Filed: Dec. 14, 2012

(65) Prior Publication Data

US 2013/0106470 A1 May 2, 2013

Related U.S. Application Data

(63) Continuation of application No. PCT/JP2012/002424, filed on Apr. 6, 2012.

(30) Foreign Application Priority Data

May 11, 2011 (JP) .................................. 2011-106181

(51) Int. Cl.
*H03K 3/00* (2006.01)
*H03K 17/56* (2006.01)
*G01R 31/26* (2014.01)
(Continued)

(52) U.S. Cl.
CPC ........... *H03K 17/56* (2013.01); *G01R 31/2607* (2013.01); *H03K 17/168* (2013.01); *G01R 19/0092* (2013.01); *H03K 17/166* (2013.01); *H03K 17/167* (2013.01); *H03K 2217/0027* (2013.01)

(58) Field of Classification Search
USPC ....................................................... 327/108
See application file for complete search history.

(56) References Cited

U.S. PATENT DOCUMENTS 6,255,867 B1 * 7/2001 Chen .............................. 327/108
6,292,014 B1 * 9/2001 Hedberg .......................... 326/30
(Continued)

FOREIGN PATENT DOCUMENTS

JP 08-274614 * 10/1996
JP 08-274614 A 10/1996
(Continued)

OTHER PUBLICATIONS

ISR issued May 22, 2012 for parent PCT/JP2012/002424.

*Primary Examiner* — Lincoln Donovan
*Assistant Examiner* — Patrick Chen
(74) *Attorney, Agent, or Firm* — Rossi, Kimms & McDowell LLP

(57) ABSTRACT

Aspects of the present invention provides a device that is capable of accurately measuring an output current of a transistor, controls the drive of a switching element, by using an existing IC tester without any evaluation board improvement. The control device according to one aspect of the present invention has: a drive circuit, a plurality of transistors for controlling the drive of a switching element and a transistor operation controller. A transistor for turning the switching element OFF is configured by a plurality of transistors. The transistor operation controller, in a normal operation, performs ON/OFF control on the two transistors simultaneously or collectively by means of the same drive signal output from the drive circuit. In a test operation, the transistor operation controller sequentially selects one of the transistors and supplies the same drive signal to the selected transistor, to drive the transistors individually.

10 Claims, 3 Drawing Sheets

(51) Int. Cl.
*H03K 17/16* (2006.01)
*G01R 19/00* (2006.01)

(56) References Cited

U.S. PATENT DOCUMENTS

| | | | |
|---|---|---|---|
| 6,404,659 B1* | 6/2002 | Oyabe | 363/132 |
| 6,556,053 B2* | 4/2003 | Stanley | 327/108 |
| 8,207,760 B2* | 6/2012 | Pham | 327/112 |
| 2006/0244496 A1* | 11/2006 | Kawakita | 327/110 |
| 2008/0278201 A1* | 11/2008 | Lee | 327/108 |
| 2008/0309378 A1* | 12/2008 | Hirose et al. | 327/50 |
| 2009/0058499 A1 | 3/2009 | Yamashiro et al. | |
| 2009/0322407 A1* | 12/2009 | Lenz et al. | 327/419 |
| 2010/0264958 A1* | 10/2010 | Nakamura et al. | 327/109 |

FOREIGN PATENT DOCUMENTS

| | | |
|---|---|---|
| JP | 2009-055696 A | 3/2009 |
| JP | 2010-075007 A | 4/2010 |

\* cited by examiner

CONTROL DEVICE

CROSS-REFERENCE TO RELATED APPLICATIONS

This application is a continuation of International Application No. PCT/JP2012/002424, filed on Apr. 6, 2012, which is based on and claims priority to Japanese Patent Application No. JP 2011-106181, filed on May 11, 2011. The disclosure of the Japanese priority application and the PCT application in their entirety, including the drawings, claims, and the specification thereof, are incorporated herein by reference.

BACKGROUND OF THE INVENTION

1. Field of the Invention

Embodiments of the invention relate to control devices for controlling the drive of a voltage-controlled switching element, such as, for example, an IGBT (Insulated Gate Bipolar Transistor).

2. Description of the Related Art

A gate drive circuit that controls the ON and OFF of an IGBT (see. e.g., Japanese Patent Application Publication No. 2009-55696) has been known in the art. This conventional device has first to third MOS transistors for turning the IGBT ON/OFF.

When turning the IGBT ON, only the first MOS transistor is turned ON to apply a power supply voltage to a gate of the IGBT. When turning the IGBT OFF, the first MOS transistor is turned OFF, and the second and third MOS transistors are turned ON, so that the charge accumulated between the gate and emitter of the IGBT is drawn out quickly during the initial stage of turning the IGBT OFF.

There is another type of conventional device. This conventional device not only controls the ON and OFF of an IGBT but also detects a current flowing to the IGBT and protects the IGBT by turning the IGBT OFF upon detection of an overcurrent.

This conventional device has a transistor for turning the IGBT ON, a transistor for turning the IGBT OFF, a transistor for protecting the IGBT from overcurrent, and various other transistors with different functions.

The transistors for turning the IGBT ON and OFF turn the IGBT ON and OFF with PWM signals and therefore require large output currents. For instance, when the rated current of the IGBT exceeds 300 A, the output currents of the transistors for turning the IGBT ON and OFF might exceed 2 A. Furthermore, the transistors for turning the IGBT ON and OFF might require a withstand voltage of 20 V or higher in order to control the drive of the IGBT.

As described above, a switching element (power device), such as an IGBT, has a rated current of several amperes to several hundred amperes, and the greater the rated current, the larger the element area of the power device. Having a large element area of the power device requires a control transistor (an output-stage transistor) of the control device controlling the drive of the power device to produce a high drive capability, which might require an output current of several amperes or more.

Due to the recent increasing demand for a high rated current of a power device, an output current of a control circuit has been increasing accordingly. However, the upper limit of a measurement current of an IC tester, which is for testing an output current of a control device, is slow to respond to such a demand prior to shipping. Thus, the upper limit has been approximately 2 A.

The design of the evaluation board can be improved by attaching a large current measuring resistor thereto, in order to measure a current greater than the upper limit by using the IC tester, but the problem is that the use of the large current measuring resistor lowers the measurement accuracy of the tester.

The use of the evaluation board with the large current measuring resistor creates a significant reduction in the measurement accuracy when the output current of the control device is low. An evaluation board with the large current measuring resistor may be used along with an evaluation board without the large current measuring resistor. A problem in this case, however, is that the costs for the testing increase due to use of the two evaluation boars. Thus, several problems exist in the related art.

SUMMARY OF THE INVENTION

Embodiments of the invention address these and other needs. Embodiments of the invention provide a control device that is capable of accurately measuring an output current of a transistor by using an existing IC tester without having an improved evaluation board, the transistor controlling the drive of a switching element.

One aspect of the invention is a control device for controlling the drive of a voltage-controlled switching element, the control device comprising: a drive circuit that generates and outputs a drive signal corresponding to an input signal; a plurality of transistors that are driven by the drive signal output from the drive circuit and control the drive of the switching element; and a transistor operation controller that controls operations of the plurality of transistors, wherein the transistor operation controller, in a normal operation, supplies the same drive signal, which is output from the drive circuit, to the plurality of transistors in order to collectively operate the plurality transistors, and, in a test operation, sequentially selects any one of the plurality of transistors and supplies the same drive signal to the selected transistor in order to individually operate the plurality of transistors.

In another aspect of the present invention, the control device may further have: an input terminal to which the input signal is input; an output terminal to which output parts of the plurality of transistors are connected in common; a power supply terminal to which a power supply voltage is supplied; and a reference voltage terminal that serves as a reference voltage.

In another aspect of the present invention, the transistor may exhibit a withstand voltage of 20 V or higher, and may either charge or discharge a gate of the switching element.

In another aspect of the present invention, the transistor may be configured by a plurality of first transistors for turning the switching element ON and a plurality of second transistors for turning the switching element OFF, wherein the transistor operation controller, in the normal operation, supplies a first drive signal, which is output from the drive circuit, to the plurality of first transistors in order to collectively operate the plurality of first transistors, and supplies a second drive signal, which is output from the drive circuit, to the plurality of second transistors in order to collectively operate the plurality of second transistors, and, in the test operation, sequentially selects any one of the plurality of first transistors and supplies the first drive signal to the selected first transistor in order to operate the plurality of first transistors individually, and sequentially selects any one of the plurality of second transistors and supplies the second drive signal to the selected second transistor in order to operate the plurality of second transistors individually.

In another aspect of the present invention, a plurality of transistors of different functions may be provided to perform operations corresponding to specificity of the drive control performed on the switching element, and at least one of the plurality of transistors of different functions may be configured by a plurality of transistors having the same function.

In another aspect of the present invention, the transistor operation controller may have a gate circuit provided between the drive circuit and the plurality of transistors, and the gate circuit, in a normal operation, may supply the drive signal output from the drive circuit, to any gates of the plurality of transistors, and, in a test operation, may supply the drive signal to the gates of the plurality of transistors selectively in response to a test signal obtained from outside.

In another aspect of the present invention, the transistor operation controller may have: a gate circuit provided between the drive circuit and the plurality of transistors; and a shift register that serially inputs input data, and converts and outputs the input data in parallel, wherein the gate circuit, in a normal operation, supplies the drive signal output from the drive circuit, to any gates of the plurality of transistors, and, in a test operation, supplies the drive signal to the gates of the plurality of transistors selectively in response to the data output from the shift register.

In another aspect of the present invention, the control device may further have: an overcurrent detection circuit that receives input of part of a current flowing to the switching element, detects, based on the input current, whether the current flowing to the switching element is an overcurrent or not, and outputs an overcurrent detection signal to the drive circuit upon detection of an overcurrent; an overheat detection circuit that receives input of a detection current of a temperature sensor that detects part of a current flowing to the switching element, determines, based on the input detection current, whether the switching element is overheated or not, and outputs an overheat detection signal to the drive circuit when determined that the switching element is overheated; and a power supply voltage detection circuit that detects a power supply voltage to be supplied to a power supply terminal, and outputs a power supply voltage abnormal signal to the drive circuit when the detected voltage is equal to or lower than a predetermined value.

In another aspect of the present invention, the control device may further have an alarm terminal, wherein, when the overcurrent detection signal is output from the overcurrent detection circuit, the overheat detection signal is output from the overheat detection circuit, or a potential drop detection signal is output from the potential drop detection circuit, the drive circuit outputs an alarm signal to the alarm terminal and stops outputting the alarm signal when an alarm factor is eliminated.

According to certain embodiments of the invention, an output current of a transistor controlling the drive of a switching element can be measured accurately by using an existing IC tester without having an improved evaluation board.

DETAILED DESCRIPTION

Embodiments of the invention are described hereinafter with reference to the drawings.

Figure 1:
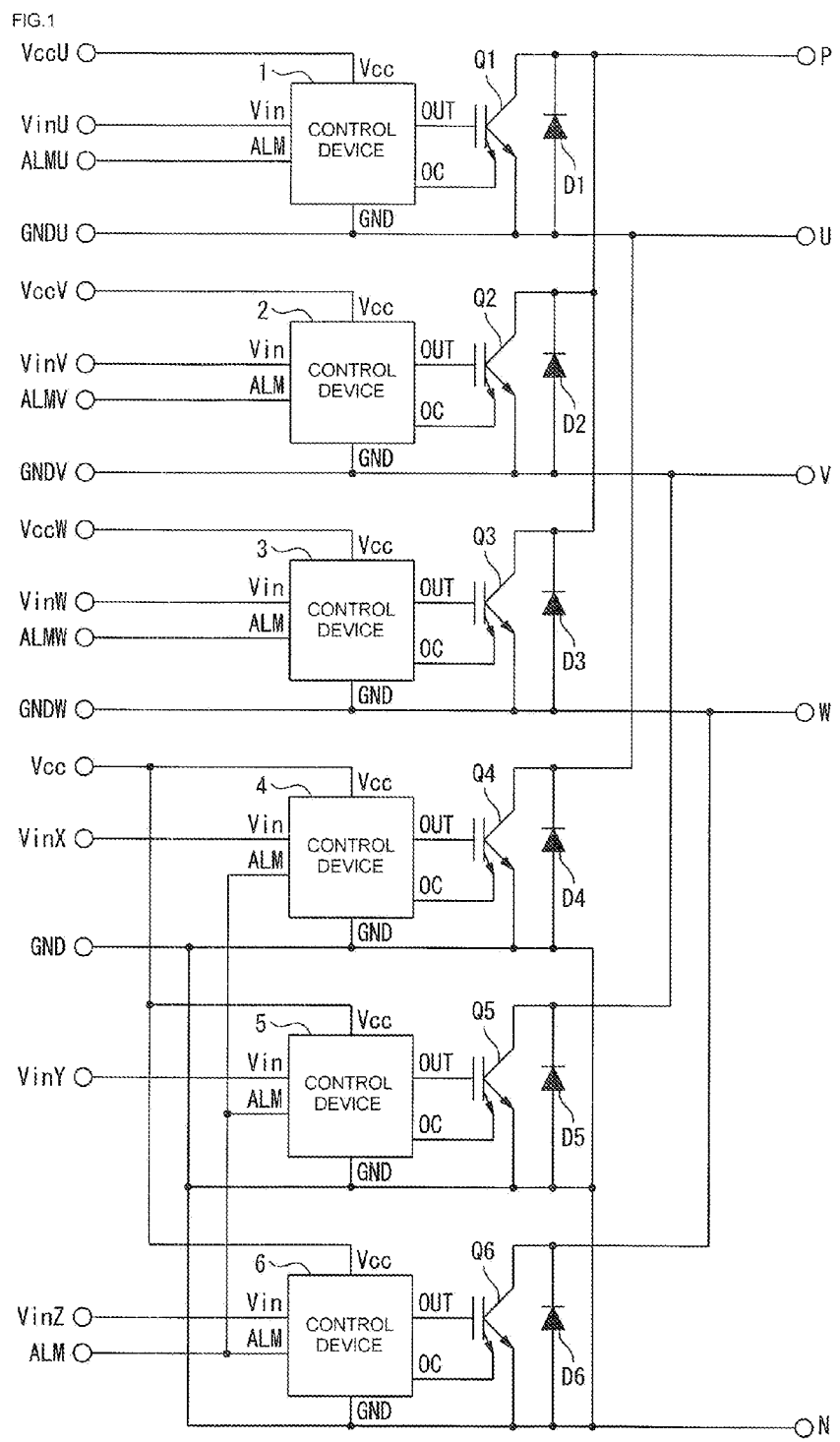
FIG. 1 is a block diagram showing a configuration of an intelligent power module to which a control device of the present invention is applied.

FIG. 1 is a block diagram showing an example of an intelligent power module (referred to as an "IPM," hereinafter) to which a control device of the present invention is applied.

[Configuration of IPM]

This IPM, which is applied to, for example, a voltage inverter for driving a motor, is provided with six switching elements Q1 to Q6, six feedback diodes D1 to D6, and control devices 1 to 6 according to the present invention, as shown in FIG. 1.

Each of the switching elements Q1 to Q6 is a voltage-controlled switching element such as an IGBT. The switching elements Q1, Q4 are connected in series. The switching elements Q2, Q5 are connected in series. The switching elements Q3, Q6 are connected in series. Each of these serially connected switching elements is connected between a positive-side main power supply terminal P and a negative-side main power supply terminal N. The common connection point between the switching elements Q1, Q4 is connected to an output terminal U. The common connection point between the switching elements Q2, Q5 is connected to an output terminal V. The common connection point between the switching elements Q3, Q6 is connected to an output terminal W.

The feedback diodes D1 to D6 are connected in parallel to the corresponding switching elements Q1 to Q6.

The control devices 1 to 6 consist of the high-potential side control devices 1 to 3 that control the drive of the switching elements Q1 to Q3 respectively, and the low-potential side control devices 4 to 6 that control the drive of the switching elements Q4 to Q6 respectively. Each of the control devices 1 to 6 has a power supply voltage terminal Vcc, a reference potential terminal GND, an input terminal Vin, an output terminal OUT, an overcurrent detection terminal OC, and an alarm terminal ALM.

The power supply voltage terminals Vcc of the control devices 1 to 3 are connected to high-voltage side power supply voltage terminals VccU, VccV, and VccW, respectively. The reference potential terminals GND of the control devices 1 to 3 are connected to high-voltage side reference potential terminals GNDU, GNDV, and GNDW, respectively, as well as to the output terminals U, V, and W, respectively. The input terminals Vin of the control devices 1 to 3 are connected to high-voltage side input terminals VinU, VinV, and VinW, respectively. The output terminals OUT of the control devices 1 to 3 are connected to gates of the switching elements Q1 to G3, respectively. The overcurrent detection terminals OC of the control devices 1 to 3 are connected to current output terminals of the switching elements Q1 to Q3, respectively. The alarm terminals ALM of the control devices 1 to 3 are connected to high-voltage side alarm terminals ALMU, ALMV, and ALMW, respectively.

The power supply voltage terminals Vcc of the control devices 4 to 6 are connected to one another, and the common connection point therebetween is connected to a low-voltage side power supply voltage terminal Vcc. The reference potential terminals GND of the control devices 4 to 6 are connected to one another, and the common connection point therebetween is connected to the main power supply terminal N. The input terminals Vin of the control devices 4 to 6 are connected to low-voltage side input terminals VinX, VinY, and VinZ, respectively. The output terminals OUT of the control devices 4 to 6 are connected to gates of the switching elements Q4 to Q6, respectively. The overcurrent detection terminals OC of the control devices 4 to 6 are connected to current output terminals of the switching elements Q4 to Q6, respectively. The alarm terminals ALM of the control devices 4 to 6 are connected to one another, and the common connection therebetween is connected to a low-voltage side alarm terminal ALM.

The control devices 1 to 6 here are provided with not only the terminals described above but also test terminals, described hereinafter, which are used in a shipping inspection (test operation); however, the test terminals are not shown in FIG. 1.

First Embodiment of Control Device

Figure 2:
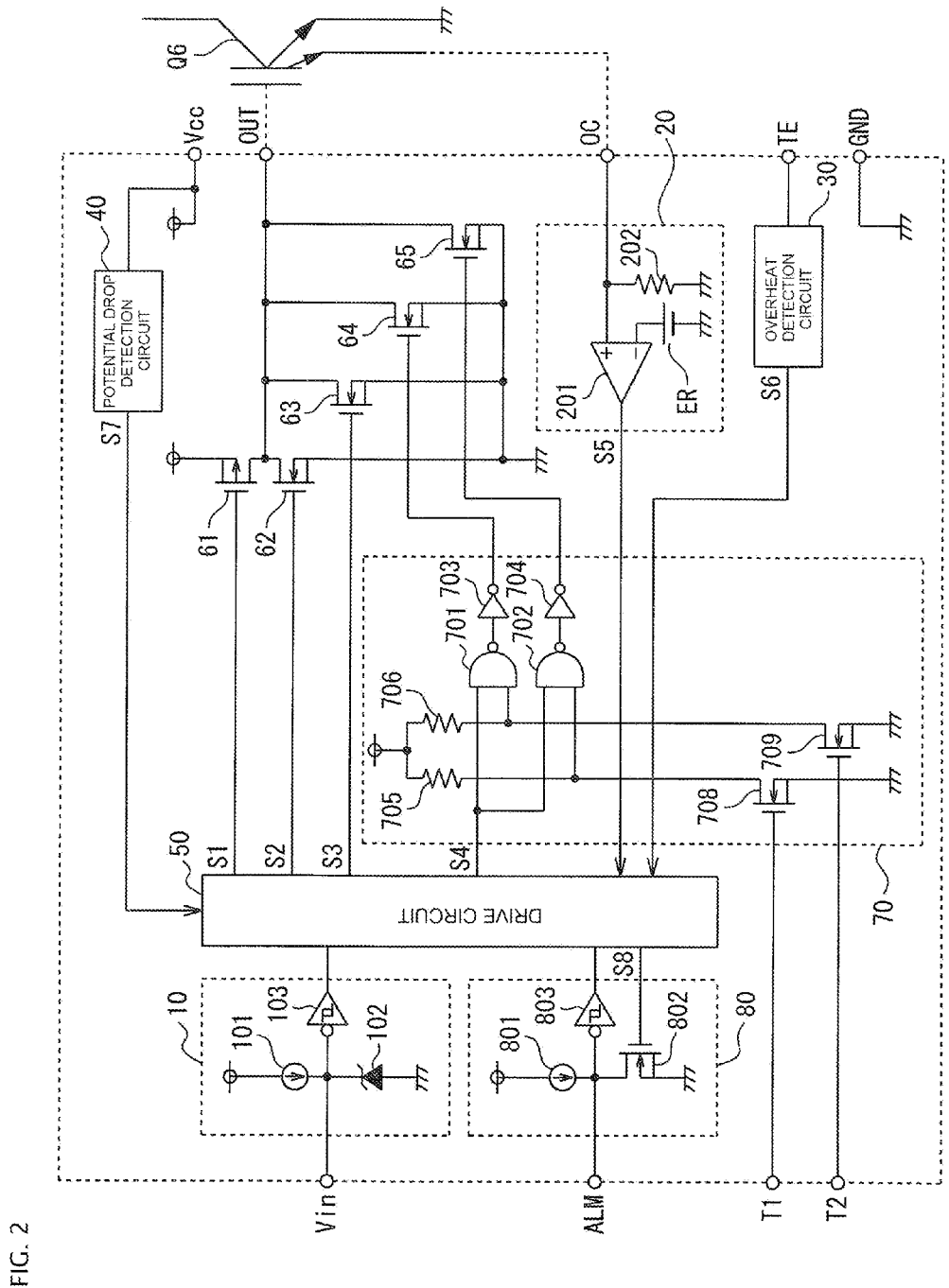
FIG. 2 is a circuit diagram showing a configuration of the control device according to a first embodiment of the present invention.

FIG. 2 is a circuit diagram showing a configuration of the control device according to a first embodiment of the present invention.

The control device according to the first embodiment is applied to the control devices 1 to 6 of the IPM shown in FIG. 1.

This control device corresponds to, for example, the control device 6 shown in FIG. 1 and controls the drive of the switching element Q6 connected to the output terminal OUT, as shown in FIG. 2.

Therefore, the control device has an input signal receiving circuit 10, an overcurrent detection circuit 20, an overheat detection circuit 30, a potential drop detection circuit 40, a drive circuit 50, a plurality of transistors 61 to 65, a transistor operation controller 70, and an alarm output circuit 80, as shown in FIG. 2.

This control device also has the power supply voltage terminal Vcc, the reference potential terminal GND, the input terminal Vin, the output terminal OUT, the overcurrent detection terminal OC, an overheat detection terminal TE, the alarm terminal ALM, and test terminals T1, T2.

Each of the plurality of transistors 61 to 65 has the following functions for controlling the drive of the switching element Q6. A transistor having a withstand voltage of 20 [V] or higher is used as each of these transistors. The output terminals of the plurality of transistors 61 to 65 are all connected to the output terminal OUT.

The transistor 61 function as a turn-ON transistor that is used for normally turning the switching element Q6 ON, the switching element Q6 being connected to the output terminal OUT. The transistor 61 is a P-type MOS transistor and generates an output current of, for example, 1.5 A.

The transistor 62 functions as a soft interruption transistor that is used for gradually turning the switching element Q6 OFF when the overcurrent detection circuit 20 detects an overcurrent. This transistor 62 is an N-type MOS transistor and generates an output current of, for example, 200 mA.

The transistor 63 is an OFF-protection transistor that is used for lowering an output impedance in order to prevent a malfunction from occurring when the switching element Q6 is turned ON normally. The transistor 63 is an N-type MOS transistor and generates an output current of, for example, 1 A.

The transistors 64, 65 equally function as a turn-OFF transistor that is used for normally turning the switching element Q6 OFF. This turn-OFF transistor is divided into the plurality of transistors 64, 65. The transistors 64, 65 each generate an output current of, for example, 1.5 A. Thus, these two transistors 64, 65 function to generate an output current of 3 A in total.

Instead of configuring the turn-OFF transistor by means of a single transistor, the turn-OFF transistor may be divided into a plurality of transistors to have a capacity (output current) smaller than that of the single transistor.

Next, each of the circuits provided in embodiments of the control device is described in detail.

The input signal receiving circuit 10 receives an input signal to be supplied to the input terminal Vin, and outputs a signal to the drive circuit 50 in response to the reception. The input signal receiving circuit 10, therefore, is configured by a current source 101, zener diode 102, and hysteresis inverter 103.

The overcurrent detection circuit 20 detects whether a current that flows to the switching element (not shown) connected to the output terminal OUT is an overcurrent or not. Upon detection of an overcurrent, the overcurrent detection circuit 20 outputs an overcurrent detection signal S5 to the drive circuit 50.

The overcurrent detection circuit 20, therefore, has a comparator 201 and a resistor 202. The overcurrent detection circuit 20 inputs part of the current flowing into the switching element, to the overcurrent detection terminal OC, and causes either end of the resistor 201 to generate a detection voltage based on the input current. The comparator 201 compares the detection voltage with a reference voltage ER. When the detection voltage is equal to or greater than the reference voltage ER, the overcurrent detection signal S5 is output to the drive circuit 50.

The overheat detection circuit 30 detects whether the switching element (not shown) connected to the output terminal OUT is overheated or not. When detecting that the switching element is overheated, the overheat detection circuit 30 outputs an overheat detection signal S6 to the drive circuit 50.

Therefore, the overheat detection circuit 30 inputs, to the overheat detection terminal TE, a detection current obtained from a temperature sensor (not shown) that detects part of current flowing to the switching element. The overheat detection circuit 30 then determines, based on the detection current, whether the switching element is overheated or not. When determined that the switching element is overheated, the overheat detection circuit 30 outputs the overheat detection signal S6 to the drive circuit 50.

The potential drop detection circuit 40 detects a power supply voltage to be supplied to the power supply voltage terminal Vcc. When this detected voltage is equal to or lower than a predetermined value, the potential drop detection circuit 40 outputs a potential drop signal S7 to the drive circuit 50.

Based on the input signal received by the input signal receiving circuit 10, the drive circuit 50 outputs a drive signal S1 for turning the switching element Q6 ON and a drive signal S4 for turning the switching element Q6 OFF. Thus, when turning the switching element Q6 ON, only the transistor 61 is turned ON by the drive signal S1, and the power supply voltage Vcc is applied to the gate of the switching element Q6, charging the gate. When turning the switching element Q6 OFF, only the turn-OFF transistors 64, 65 are turned ON collectively by the drive signal S4.

Consequently, the gate of the switching element Q6 is connected to the ground, discharging a gate charge.

Furthermore, based on the overcurrent detection signal S5 that is output from the overcurrent detection circuit 20 and the overheat detection signal S6 that is output from the overheat detection circuit 30, the drive circuit 50 outputs a drive signal S2 when gently turning the switching element Q6 ON. As a result, the drive signal S2 turns the soft interruption transistor 62 ON. Then, the gate of the switching element Q6 is connected to the ground, gradually discharging the gate charge.

In addition, based on the potential drop signal S7 that is output from the potential drop detection circuit 40, the drive circuit 50 outputs a drive signal S3 when turning the switching element Q6 OFF for the purpose of protecting the switching element Q6. As a result, the drive signal S3 turns the OFF-protection transistor 63 ON. Then, the gate of the switching element Q6 is connected to the ground, to protect the switching element Q6.

When the overcurrent detection signal S5 is output from the overcurrent detection circuit 20, or when the overheat detection signal S6 is output from the overheat detection circuit 30, or when the potential drop detection signal S7 is sent from the potential drop detection circuit 40, the drive circuit 50 outputs an alarm signal S8 to the alarm output circuit 80. The drive circuit 50 stops outputting the alarm signal S8 when an alarm factor is eliminated.

When the alarm signal S8 is output from the drive circuit 50, the alarm output circuit 80 outputs the alarm signal S8 to the alarm terminal ALM but stops outputting the alarm signal S8 when the alarm factor is eliminated.

The alarm output circuit 80, therefore, is configured by a current source 801, transistor 802, and hysteresis inverter 803.

Certain embodiments of the transistor operation controller 70 is described next.

The transistor operation controller 70 causes the two transistors 64, 65 having the same function to achieve the primary functions thereof during a normal operation, and operates the two transistors 64, 65 individually during a test operation so that the output currents thereof can be measured using an IC tester.

In other words, the transistor operation controller 70, in the normal operation, performs ON/OFF control on the two transistors 64, 65 simultaneously or collectively by means of the same drive signal S4 output from the drive circuit 50. In the test operation, on the other hand, the transistor operation controller 70 sequentially selects any one of the two transistors 64, 65 one by one, supplies the same drive signal S4 to the selected transistor, and drives the two transistors 64, 65 individually.

The transistor operation controller 70 has NAND circuits 701, 702, an inverter circuit 703, pull-up resistors 705, 706, and transistors 708, 709, as shown in FIG. 2.

The drive signal S4 that is output from the drive circuit 50 is input to each of input terminals on one side of the NAND circuits 701, 702. A power supply voltage is applied to an input terminal on the other side of the NAND circuit 701 via the pull-up resistor 706. The input terminal on the other side of the NAND circuit 701 is connected to the ground by the transistor 709. A power supply voltage is applied to an input terminal on the other side of the NAND circuit 702 via the pull-up resistor 705. The input terminal on the other side of the NAND circuit 702 is connected to the ground by the transistor 708. An output terminal of the NAND circuit 701 is connected to the gate of the transistor 64 by the inverter circuit 703. An output terminal of the NAND circuit 702 is connected to the gate of the transistor 65 by the inverter circuit 704.

The NAND circuit 701 and the inverter circuit 703 each functions as an AND circuits. The NAND circuit 702 and the inverter circuit 704 each functions as an AND circuits as well. The inverter circuits 703, 704 function as buffer circuits.

The control device having such a configuration is produced in semiconductor wafer processing, and the shipping inspection (test operation) is performed on the control device by probing a silicon wafer. The IC tester is used in the shipping inspection of the control device, to measure the output currents of the output-stage transistors 61 to 65.

Incidentally, when an upper limit of a measurement current of the IC tester is 2 A, and the output current obtained from the combination of the turn-OFF transistors 64, 65 is 3 A, the output currents cannot be measured with the IC tester.

In this control device, however, the turn-OFF transistors consist of the plurality of transistors 64, 65 so an output current of, for example, 1.5 A is obtained from each of the transistors 64, 65. Moreover, the control device is provided with the transistor operation controller 70.

Operations of the transistor operation controller 70 are described next.

Operations that are performed in the normal operation and test operation by the transistor operation controller 70 are described.

First of all, in the test operation, application of a H-level (high-level) signal to the test terminal T1 turns the transistor 708 ON. Consequently, one of the input terminals of the NAND circuit 702 becomes L level (low level). However, since the transistor 709 is OFF, one of the input terminals of the NAND circuit 701 becomes H level. Therefore, the drive signal S4 that is output from the drive circuit 50 is supplied to the gate of the transistor 64 via the NAND circuit 701 and the inverter 703. The output current of the transistor 64 can be measured with the IC tester, once the transistor 64 is turned ON by the drive signal S4.

Next, application of an H-level signal to only the test terminal T2 turns the transistor 709 ON. Consequently, one of the input terminals of the NAND circuit 701 becomes L level (low level). However, since the transistor 708 is OFF, one of the input terminals of the NAND circuit 702 becomes H level. Therefore, the drive signal S4 that is output from the drive circuit 50 is supplied to the gate of the transistor 65 via the NAND circuit 702 and the inverter 704. The output current of the transistor 65 can be measured with the IC tester, once the transistor 65 is turned ON by the drive signal S4.

In the normal operation, on the other hand, the transistors 708, 709 are not operated. Therefore, power supply voltages are applied to the input terminals on one side of the NAND circuits 701, 702 via the pull-up resistors 705, 706, making the input terminals on one side of the NAND circuits 701, 702 H level.

Thus, the drive signal S4 that is output from the drive circuit 50 is supplied to the gate of the transistor 64 via the NAND circuit 701 and the inverter 703 and to the gate of the transistor 65 via the NAND circuit 702 and the inverter 704. As a result, the transistors 64, 65 are driven collectively by the same drive signal S4.

As described above, in the first embodiment of the control device of the present invention, the turn-OFF transistors for turning the switching element OFF are divided into the two transistors 64, 65. In addition to such a configuration, the transistor operation controller 70 is provided in the first embodiment.

Therefore, according to the first embodiment, in the shipping inspection, which is the test operation, the two transistors 64, 65 can be operated individually to accurately be measure the output currents thereof by using an existing IC tester without having an improved evaluation board. Furthermore, in the normal operation subsequent to shipping, the two transistors 64, 65 with the same function can be operated to achieve the primary functions thereof.

Second Embodiment of Control Device

Figure 3:
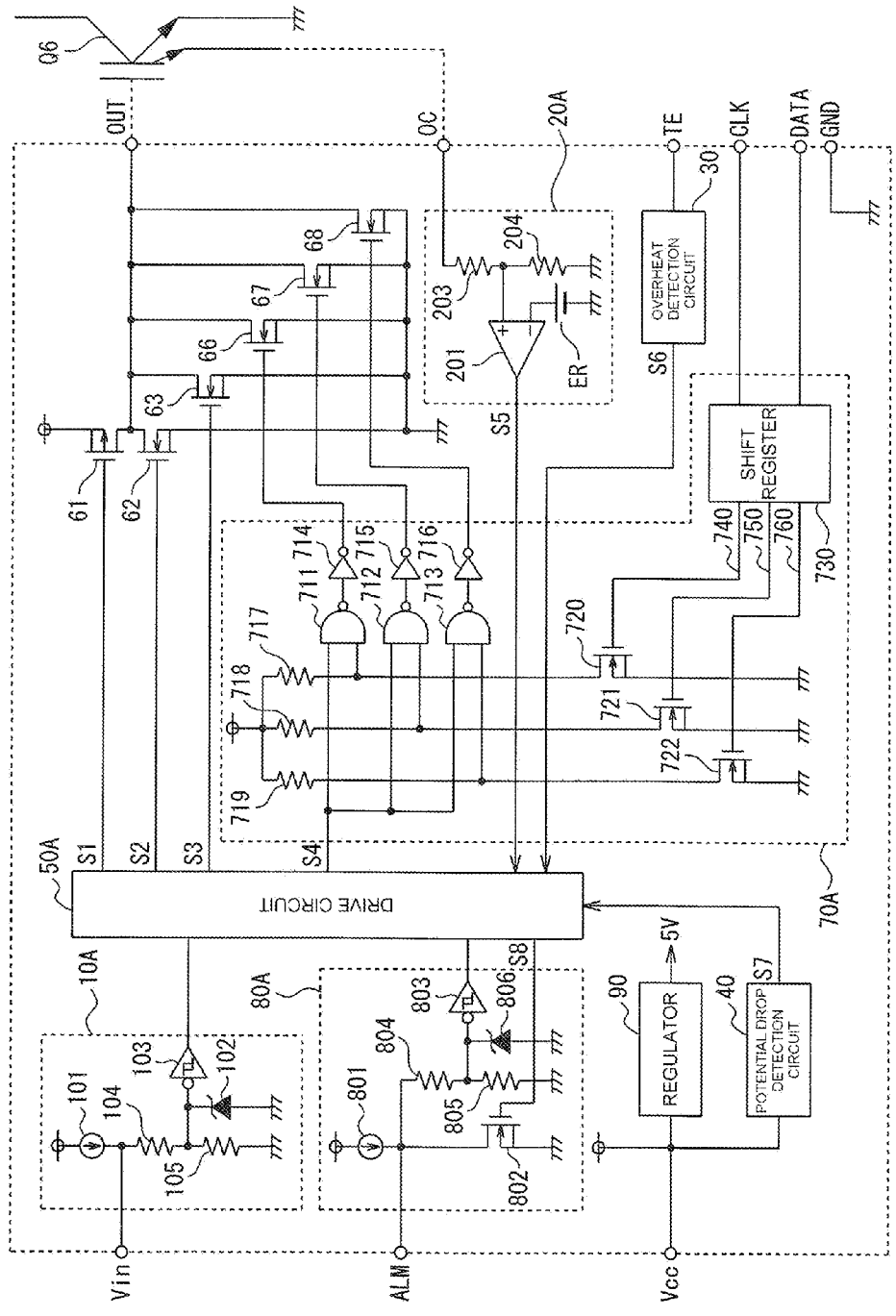
FIG. 3 is a circuit diagram showing a configuration of the control device according to a second embodiment of the present invention.

FIG. 3 is a circuit diagram showing a configuration of the control device according to a second embodiment of the present invention.

The control device according to the second embodiment is applied to the control devices 1 to 6 of the IPM shown in FIG. 1.

This control device corresponds to, for example, the control device 6 shown in FIG. 1 and controls the drive of the switching element Q6 connected to the output terminal OUT, as shown in FIG. 3.

Therefore, the control device has an input signal receiving circuit 10A, an overcurrent detection circuit 20A, an overheat detection circuit 30, a potential drop detection circuit 40, a drive circuit 50A, a plurality of transistors 61 to 63 and 66 to 68, a transistor operation controller 70A, an alarm output circuit 80A, and a regulator 90, as shown in FIG. 3.

This control device also has the power supply voltage terminal Vcc, the reference potential terminal GND, the input terminal Vin, the output terminal OUT, the overcurrent detection terminal OC, the overheat detection terminal TE, the alarm terminal ALM, a data input terminal DATE, and a clock input terminal CL.

In this control device, a power supply voltage of approximately 15 [V] is applied to the power supply voltage terminal Vcc. The plurality of transistors 61 to 63 and 66 to 68 are operated by this power supply voltage. The regulator 90 generates a voltage of 5 [V] stabilized by the power supply voltage. The circuits and parts are operated by this generated voltage.

Each of the plurality of transistors 61 to 63 and 66 to 68 has the following functions for controlling the drive of the switching element Q6. A transistor having a withstand voltage of 20 [V] or higher is used as each of these transistors. The output terminals of the plurality of transistors 61 to 63 and 66 to 68 are all connected to the output terminal OUT.

The transistors 61 to 63 have the same function as the transistors 61 to 63 shown in FIG. 1. In this example, however, an output current of the turn-ON transistor 61 is 1 A. An output current of the soft interruption transistor 62 is 400 mA.

The transistors 66 to 68 have the same function as turn-OFF transistors used for normally turning the switching element Q6 OFF. The turn-OFF transistors consist of the divided plurality of transistors 66 to 68, and an output current of each of the transistors 66 to 68 is, for example, 1 A. Thus, these three transistors 66 to 68 function to generate an output current of 3 A in total.

Next, circuits provided in embodiments of the control device are described in detail.

The input signal receiving circuit 10A receives an input signal to be supplied to the input terminal Vin, and outputs a signal to the drive circuit 50A in response to the reception.

The input signal receiving circuit 10, therefore, is configured by a current source 101, resistors 104, 105, a zener diode 102, and a hysteresis inverter 103.

The overcurrent detection circuit 20A detects whether a current that flows to the switching element Q6 connected to the output terminal OUT is an overcurrent or not. Upon detection of an overcurrent, the overcurrent detection circuit 20A outputs the overcurrent detection signal S5 to the drive circuit 50A.

The overcurrent detection circuit 20A, therefore, has a comparator 201 and partial resistors 203, 204. The overcurrent detection circuit 20A inputs part of the current flowing into the switching element Q6, to the overcurrent detection terminal OC, and causes the partial resistors 203, 204 to generate a partial voltage based on the input current. The comparator 201 compares the partial voltage with the reference voltage ER. When the partial voltage is equal to or greater than the reference voltage ER, the overcurrent detection signal S5 is output to the drive circuit 50A.

The overheat detection circuit 30, having the same configuration as the overheat detection circuit 30 shown in FIG. 2, output the overheat detection signal S6 to the drive circuit 50A. The potential drop detection circuit 40, having the same configuration as the potential drop detection circuit 40 shown in FIG. 2, outputs the potential drop signal S7 to the drive circuit 50A.

Based on the input signal received by the input signal receiving circuit 10A, the drive circuit 50A outputs a drive signal S1 for turning the switching element Q6 ON and a drive signal S4 for turning the switching element Q6 OFF. Thus, when turning the switching element Q6 ON, only the transistor 61 is turned ON by the drive signal S1, and the power supply voltage Vcc is applied to the gate of the switching element Q6, charging the gate. When turning the switching element Q6 OFF, only the turn-OFF transistors 66 to 68 are turned ON collectively by the drive signal S4. Consequently, the gate of the switching element Q6 is connected to the ground, discharging a gate charge.

Furthermore, based on the overcurrent detection signal S5 that is output from the overcurrent detection circuit 20A and the overheat detection signal S6 that is output from the overheat detection circuit 30, the drive circuit 50A outputs a drive signal S2 when gently turning the switching element Q6 ON. As a result, the drive signal S2 turns the soft interruption transistor 62 ON. Then, the gate of the switching element Q6 is connected to the ground, gradually discharging the gate charge.

In addition, based on the potential drop signal S7 that is output from the potential drop detection circuit 40, the drive circuit 50A outputs a drive signal S3 when turning the switching element Q6 OFF for the purpose of protecting the switching element Q6. As a result, the drive signal S3 turns the OFF-protection transistor 63 ON. Then, the gate of the switching element Q6 is connected to the ground, to protect the switching element Q6.

When the overcurrent detection signal S5 is output from the overcurrent detection circuit 20A, or when the overheat detection signal S6 is output from the overheat detection circuit 30, or when the potential drop detection signal S7 is sent from the potential drop detection circuit 40, the drive circuit 50A outputs an alarm signal S8 to the alarm output circuit 80A. The drive circuit 50A stops outputting the alarm signal S8 when an alarm factor is eliminated.

When the alarm signal S8 is output from the drive circuit 50A, the alarm output circuit 80A outputs the alarm signal S8 to the alarm terminal ALM but stops outputting the alarm signal S8 when the alarm factor is eliminated.

The alarm output circuit 80A, therefore, is configured by a current source 801, a transistor 802, resistors 804, 805, a zener diode 806, and a hysteresis inverter 803.

A transistor operation controller 70A, in accordance with certain embodiments, is described next.

The transistor operation controller 70A causes the three transistors 66 to 68 having the same function to achieve the primary functions thereof during a normal operation, and operates the three transistors 66 to 68 individually during a test operation so that the output currents thereof can be measured using an IC tester.

In other words, the transistor operation controller 70A, in the normal operation, performs ON/OFF control on the three transistors 66 to 68 simultaneously or collectively by means of the same drive signal S4 output from the drive circuit 50A. In the test operation, on the other hand, the transistor operation controller 70A sequentially selects any one of the three transistors 66 to 68 one by one, supplies the same drive signal S4 to the selected transistor, and drives the three transistors 66 to 68 individually.

The transistor operation controller 70A has NAND circuits 711 to 713, inverter circuits 714 to 716, pull-up resistors 717 to 719, transistors 720 to 722, and a shift register 730, as shown in FIG. 3.

The drive signal S4 that is output from the drive circuit 50A is input to each of input terminals on one side of the NAND circuits 711 to 713. A power supply voltage is applied to each of input terminals on the other side of the NAND circuits 711 to 713 via the pull-up resistors 717 to 719. The other input terminals of the NAND circuits 711 to 713 are connected to the ground by the transistors 720 to 722. Outputs of output terminals 740, 750, 760 of the shift register 730 are input to gates of the transistors 720 to 722.

The shift register 730 sequentially receives input of input data by means of a clock and outputs the input data from the output terminals 740, 750, 760 in parallel. Therefore the shift register 730 is connected to the data input terminal DATA to which the data are input and the clock input terminal CLK to which the clock is input.

The control device having such a configuration is produced in semiconductor wafer processing, and the shipping inspection (test operation) is performed on the control device by probing a silicon wafer. The IC tester is used in the shipping inspection of the control device, to measure the output currents of the output-stage transistors 61 to 63 and 66 to 68.

Incidentally, when an upper limit of a measurement current of the IC tester is 2 A, and the output current obtained from the group of the turn-OFF transistors 66 to 68 is 3 A, the output currents cannot be measured with the IC tester.

In this control device, however, the turn-OFF transistors consist of the plurality of transistors 66 to 68 so an output current of, for example, 1 A is obtained from each of the transistors 66 to 68. Moreover, the control device is provided with the transistor operation controller 70A.

Operations of the transistor operation controller 70A, of certain embodiments of the invention, are described next.

Operations that are performed in the normal operation and test operation by the transistor operation controller 70A are described.

First of all, in the test operation, the shift register 730 is operated by the clock. Test data are sequentially input to the shift register 730. The input data are output from the output terminals 740, 750, 760 and supplied to gates of the transistors 720 to 722.

When the levels of the output terminals 740, 750, 760 of the shift register 730 are "L level," "H level," and "H level," respectively, the transistor 720 is turned OFF and the transistors 721 and 722 are turned ON. At this moment, only the input terminal on one side of the NAND circuit 711 is kept at the H level, and the levels of both input terminals on one side of the NAND circuits 712, 713 become L levels. As a result, the drive signal S4 that is output from the drive circuit 50A can be supplied to the gate of the transistor 66 via the NAND circuit 711 and the inverter 714. The output current of the transistor 66 can be measured with the IC tester when the transistor 66 is turned ON by the drive signal S4.

Subsequently, when the levels of the output terminals 740, 750, 760 of the shift register 730 are "H level," "L level," and "H level," respectively, the transistors 720 and 722 are turned ON and the transistor 721 is turned OFF. At this moment, only the input terminal on one side of the NAND circuit 712 is kept at the H level, and the levels of both input terminals on one side of the NAND circuits 711, 713 become L levels. As a result, the drive signal S4 that is output from the drive circuit 50A can be supplied to the gate of the transistor 67 via the NAND circuit 712 and the inverter 715. The output current of the transistor 67 can be measured with the IC tester when the transistor 67 is turned ON by the drive signal S4.

Thereafter, when the levels of the outputs of the output terminals 740, 750, 760 of the shift register 730 are "H level," "H level," and "L level," respectively, the transistors 720 and 721 are turned ON and the transistor 722 is turned OFF. At this moment, only the input terminal on one side of the NAND circuit 713 is kept at the H level, and the levels of both input terminals on one side of the NAND circuits 711, 712 become L levels. As a result, the drive signal S4 that is output from the drive circuit 50A can be supplied to the gate of the transistor 68 via the NAND circuit 713 and the inverter 716. The output current of the transistor 68 can be measured with the IC tester when the transistor 68 is turned ON by the drive signal S4.

In the normal operation, on the other hand, the transistors 720 to 722 and the shift register 730 are not operated. Therefore, power supply voltages are applied to the input terminals on one side of the NAND circuits 711 to 713 via the pull-up resistors 711 to 719, making the input terminals on one side of the NAND circuits 711 to 713 H level.

Thus, the drive signal S4 that is output from the drive circuit 50A is supplied to the gate of the transistor 66 via the NAND circuit 711 and the inverter 714, to the gate of the transistor 67 via the NAND circuit 712 and the inverter 715, and to the gate of the transistor 68 via the NAND circuit 713 and the inverter 716. As a result, the transistors 66 to 68 are driven collectively by the same drive signal S4.

As described above, in the second embodiment of the control device of the present invention, the turn-OFF transistors for turning the switching element OFF are divided into the three transistors 66 to 68. In addition to such a configuration, the transistor operation controller 70A is provided in the second embodiment.

Therefore, according to the second embodiment, in the shipping inspection, which is the test operation, the three transistors 66 to 68 can be operated individually to accurately be measure the output currents thereof by using an existing IC tester without having an improved evaluation board. Furthermore, in the normal operation subsequent to shipping, the three transistors 66 to 68 with the same function can be operated to achieve the primary functions thereof.

Other Embodiments (1) In the first embodiment, the transistors for turning the switching element OFF are configured by the plurality of transistors 64, 65, and the transistor operation controller 70 is provided accordingly.

However, the transistor 61 for turning the switching element ON, the transistor 63 for protecting the switching element, and other transistors may be configured by a plurality of transistors. In this case, a transistor operation controller similar to the transistor operation controller 70 is provided between the drive circuit 50 and the plurality of transistors.

(2) In the second embodiment, the transistors for turning the switching element OFF are configured by the plurality of transistors 66 to 68, and the transistor operation controller 70A is provided accordingly.

However, the transistor 61 for turning the switching element ON, the transistor 63 for protecting the switching element, and other transistors may be configured by a plurality of transistors. In this case, a transistor operation controller similar to the transistor operation controller 70A is provided between the drive circuit 50A and the plurality of transistors.

(3) In the embodiments, an IGBT was described as an example of the switching element; however, the present invention can be applied to control the drive of a power transistor and the like.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed:

1. A control device for controlling the drive of a voltage-controlled switching element, the control device comprising:
   a drive circuit that generates and outputs a drive signal corresponding to an input signal;
   a plurality of transistors that are driven by the drive signal output from the drive circuit and control the drive of the switching element; and
   a transistor operation controller that controls operations of the plurality of transistors,
   wherein the transistor operation controller, in a normal operation, supplies the same drive signal, which is output from the drive circuit, to the plurality of transistors in order to collectively operate the plurality of transistors, and, in a test operation, sequentially selects any one of the plurality of transistors and supplies the same drive signal to the selected transistor in order to individually operate the plurality of transistors; wherein
   the transistor operation controller includes a plurality of test transistors,
   in the normal operation, none of the test transistors are turned on, and
   in the test operation, any one of the plurality of transistors is selected by one or more of the test transistors being turned on,
   the transistor operation controller further including
   a gate circuit provided between the drive circuit and the plurality of transistors; and
   a shift register that serially inputs input data, and converts and outputs the input data in parallel, wherein
   the gate circuit, in the normal operation, supplies the drive signal output from the drive circuit, to any gates of the plurality of transistors, and, in the test operation, supplies the drive signal to the gates of the plurality of transistors selectively in response to the data output from the shift register, and
   the test operation is triggered based on the contents of the input data.

2. The control device according to claim 1, further comprising:
   an input terminal to which the input signal is input;
   an output terminal to which output parts of the plurality of transistors are connected in common;
   a power supply terminal to which a power supply voltage is supplied; and
   a reference voltage terminal that serves as a reference voltage.

3. The control device according to claim 1, wherein the transistor exhibits a withstand voltage of 20 V or higher.

4. The control device according to claim 1, wherein the transistor either charges or discharges a gate of the switching element.

5. The control device according to claim 1, wherein
   the transistor is configured by a plurality of first transistors for turning the switching element ON and a plurality of second transistors for turning the switching element OFF, and wherein
   the transistor operation controller,
   in the normal operation, supplies a first drive signal, which is output from the drive circuit, to the plurality of first transistors in order to collectively operate the plurality of first transistors, and supplies a second drive signal, which is output from the drive circuit, to the plurality of second transistors in order to collectively operate the plurality of second transistors, and,
   in the test operation, sequentially selects any one of the plurality of first transistors and supplies the first drive signal to the selected first transistor in order to operate the plurality of first transistors individually, and sequentially selects any one of the plurality of second transistors and supplies the second drive signal to the selected second transistor in order to operate the plurality of second transistors individually.

6. The control device according to claim 1, wherein
   a plurality of the transistors of different functions are provided to perform operations corresponding to specificity of the drive control performed on the switching element, and
   at least one of the plurality of transistors of different functions is configured by a plurality of transistors having the same function.

7. The control device according to claim 1, further comprising an overcurrent detection circuit that receives input of part of a current flowing to the switching element, detects, based on the input current, whether the current flowing to the switching element is an overcurrent or not, and outputs an overcurrent detection signal to the drive circuit upon detection of an overcurrent.

8. The control device according to claim 1, further comprising an overheat detection circuit that receives input of a detection current of a temperature sensor that detects part of a current flowing to the switching element, determines, based on the input detection current, whether the switching element is overheated or not, and outputs an overheat detection signal to the drive circuit when determined that the switching element is overheated.

9. The control device according to claim 1, further comprising a power supply voltage detection circuit that detects a power supply voltage to be supplied to a power supply terminal, and outputs a power supply voltage abnormal signal to the drive circuit when the detected voltage is equal to or lower than a predetermined value.

10. The control device according to claim 7, further comprising:
an alarm terminal, wherein
when an overcurrent detection signal is output from an overcurrent detection circuit, the overheat detection signal is output from the overheat detection circuit, or a potential drop detection signal is output from a potential drop detection circuit, the drive circuit outputs an alarm signal to the alarm terminal and stops outputting the alarm signal when an alarm factor is eliminated.

* * * * *